United States Patent
Tang et al.

(10) Patent No.: US 11,411,359 B2
(45) Date of Patent: Aug. 9, 2022

(54) INTELLIGENT POWER ADAPTER

(71) Applicant: XIAMEN ECO LIGHTING CO. LTD., Xiamen (CN)

(72) Inventors: Xiaojun Tang, Xiamen (CN); Zhongyuan Liang, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 325 days.

(21) Appl. No.: 16/820,683

(22) Filed: Mar. 16, 2020

(65) Prior Publication Data
US 2020/0303886 A1  Sep. 24, 2020

(30) Foreign Application Priority Data
Mar. 18, 2019  (CN) .......................... 201920343462.1

(51) Int. Cl.
*H01R 39/00*   (2006.01)
*H01R 31/06*   (2006.01)
*H05K 7/14*    (2006.01)
*H05K 5/00*    (2006.01)

(52) U.S. Cl.
CPC ......... *H01R 31/065* (2013.01); *H05K 5/0047* (2013.01); *H05K 7/1427* (2013.01)

(58) Field of Classification Search
CPC .. H01R 39/641; H01R 35/04; H01R 13/6395; H01R 13/02; H01R 13/06
See application file for complete search history.

(56) References Cited

U.S. PATENT DOCUMENTS

| | | | | |
|---|---|---|---|---|
| 7,983,064 B2* | 7/2011 | Zhang | .................. | H01R 12/718 439/171 |
| 8,105,106 B1* | 1/2012 | Stoddard | .............. | H01R 13/717 439/490 |
| 8,979,877 B2* | 3/2015 | Thomas | ......... | A61B 17/320758 606/159 |
| 2009/0291570 A1* | 11/2009 | Wadsworth | .......... | H01R 31/065 29/874 |

* cited by examiner

*Primary Examiner* — Phuong Chi Thi Nguyen
(74) *Attorney, Agent, or Firm* — Chun-Ming Shih; Lanway IPR Services

(57) ABSTRACT

An intelligent power adaptor includes a housing, a circuit board, a holder and a detachable intelligent current adaptor. The housing has an internal space and an insertion through hole. The circuit board is disposed within the internal space. The circuit board includes a plurality of first connecting terminals. The holder is coupled to the circuit board. Also, the holder is disposed above the circuit board and within the internal space. In addition, the holder includes an opening for encompassing the plurality of first connecting terminals. The detachable intelligent current adaptor is detachably coupled to the holder via the opening and externally coupled to the housing via the insertion through hole. The detachable intelligent current adaptor includes a plurality of second connecting terminals that are detachably docked with and electrically coupled to the plurality of first connecting terminals in one-by-one correspondence.

16 Claims, 8 Drawing Sheets

INTELLIGENT POWER ADAPTER

FIELD OF THE INVENTION

The present invention relates to an intelligent power adaptor, and more particularly, to an intelligent power adaptor that allows cooperation with various types of detachable intelligent current adaptor.

BACKGROUND OF THE INVENTION

A conventional intelligent power source ordinarily utilizes a built-in intelligent power adaptor. For example, the built-in intelligent power adaptor may be welded onto a driving circuit board and cannot be detached. However, since there are various types of intelligent power adaptors for driving a same type of power consuming device, e.g., an illuminating device, such conventional intelligent power source is highly likely lack of flexibility in adjusting its protocol of driving the power consuming device. It is because that the affixation of the built-in intelligent power adaptor onto the driving circuit board.

SUMMARY OF THE INVENTION

The present invention aims at disclosing an intelligent power adaptor having a detachable current adaptor for neutralizing defects caused by the abovementioned affixation of the built-in intelligent power adaptor.

According to an embodiment of the present invention, the intelligent power adaptor includes a housing, a circuit board, a holder and a detachable intelligent current adaptor. The housing has an internal space and an insertion through hole. The circuit board is disposed within the internal space. The circuit board includes a plurality of first connecting terminals. The holder is coupled to the circuit board. Also, the holder is disposed above the circuit board and within the internal space. In addition, the holder includes an opening for encompassing the plurality of first connecting terminals. The detachable intelligent current adaptor is detachably coupled to the holder via the opening and externally coupled to the housing via the insertion through hole. The detachable intelligent current adaptor includes a plurality of second connecting terminals that are detachably docked with and electrically coupled to the plurality of first connecting terminals in one-by-one correspondence. In one example, each of the plurality of first connecting terminals includes a first flexible piece and a first flexible piece. The second flexible piece is integrally coupled to with the first flexible piece. The first flexible piece and the second flexible piece form a clamp for clamping a corresponding second connecting terminal out of the plurality of second connecting terminals in response to insertion of the detachable intelligent current adaptor.

In one example, the circuit board includes a power input terminal and a power output terminal. The power input terminal is electrically coupled to a first set out of the plurality of first connecting terminals. The power output terminal is electrically coupled to a second set out of the plurality of first connecting terminals. The detachable intelligent current adaptor adjusts a current flowing between the power input terminal and the poser output terminal.

In one example, the circuit board also includes at least one electronic component, which is electrically coupled to a third set out of the plurality of first connecting terminals.

In one example, the holder is welded to the circuit board for forming an integral structure.

In one example, the holder includes a support body and an encompassing body. The support body is disposed on the circuit board. The opening is formed above the support body. The encompassing body is coupled to and disposed above the support body. The opening is formed within the encompassing body.

In one example, the support body is welded on the circuit board.

In one example, the support body and the encompassing body form an integral structure.

In one example, the support body includes a plurality of insulating protrusions and a plurality of indentations. Each of the plurality of indentations separates two consecutive insulating protrusions out of the plurality of insulating protrusions. Also, each of the plurality of indentations receives one corresponding first connecting terminal out of the plurality of first connecting terminals.

In one example, the encompassing body includes a plurality of lateral trenches disposed within. The plurality of lateral trenches detachably affix the detachable intelligent current adaptor upon insertion of the detachable intelligent current adaptor.

In one example, the encompassing body includes an arc-shaped base plate. The arc-shaped base plate is disposed within the opening. The arc-shaped base plate includes a seam. The seam guides the insertion of the detachable intelligent current adaptor and receives the detachable intelligent current adaptor.

In one example, the arc-shaped base plate is coupled to the support body. Such that the encompassing body is coupled to the support body.

In one example, the plurality of first connecting terminals are exposed to the detachable intelligent current adaptor via the seam.

In one example, the housing includes an upper casing and a lower casing. The upper casing includes an insertion through hole for allowing the detachable intelligent current adaptor to pass through. The lower casing is detachably coupled to the upper casing. The lower casing loads the circuit board.

In one example, the intelligent power adaptor further includes a cap for covering the insertion through hole.

In one example, the housing includes an input jack for electrically coupled to an external power source and the power input terminal.

In one example, the housing includes an output jack for electrically coupled to an external power consuming device and the power output terminal.

In one example, the housing includes a network socket for electrically coupled to an external communication device.

These and other objectives of the present invention will no doubt become obvious to those of ordinary skill in the art after reading the following detailed description of the preferred embodiment that is illustrated in the various figures and drawings.

DETAILED DESCRIPTION

As mentioned above, the present invention discloses an intelligent power adaptor capable of switching its detachable intelligent current adaptor. In this way, the disclosed intelligent power adaptor is capable of configuring various protocols of driving a corresponding power consuming device.

Figure 1:
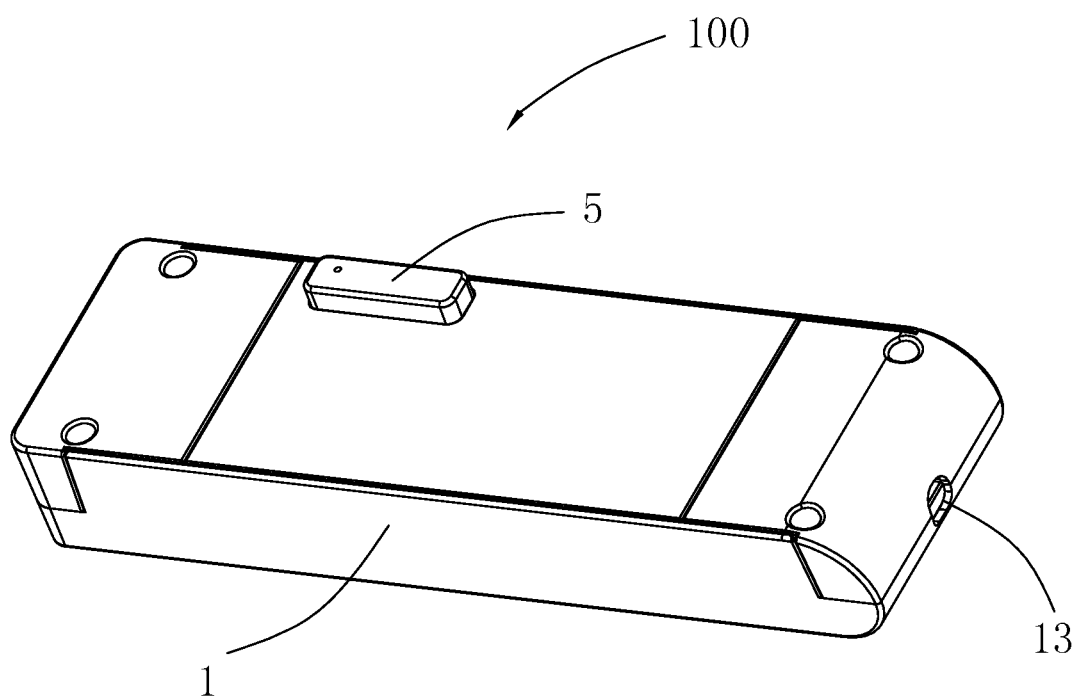
FIG. 1 and FIG. 2 illustrate a top view of an intelligent power adaptor according to one embodiment.
Figure 2:
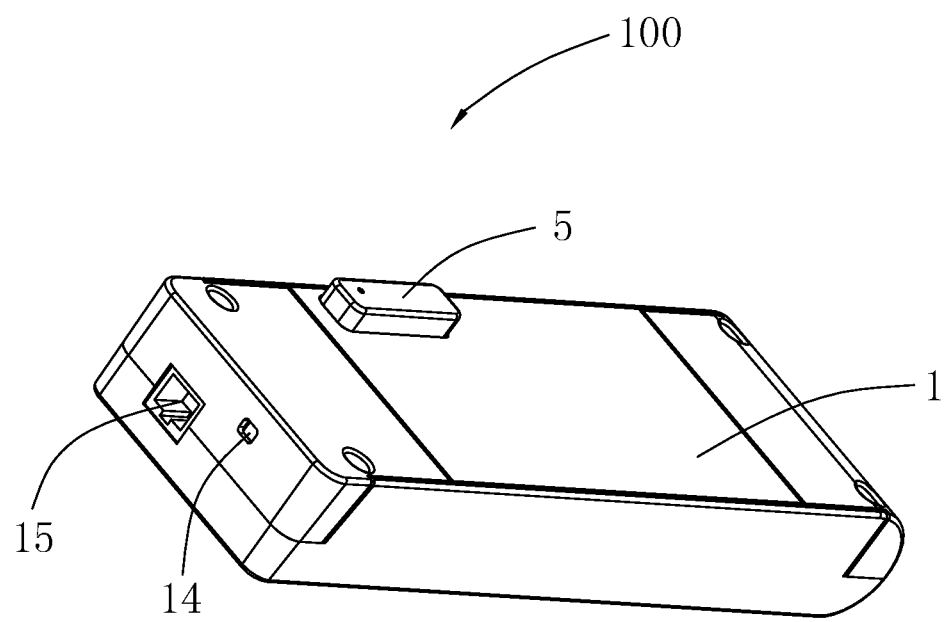
Figure 3:
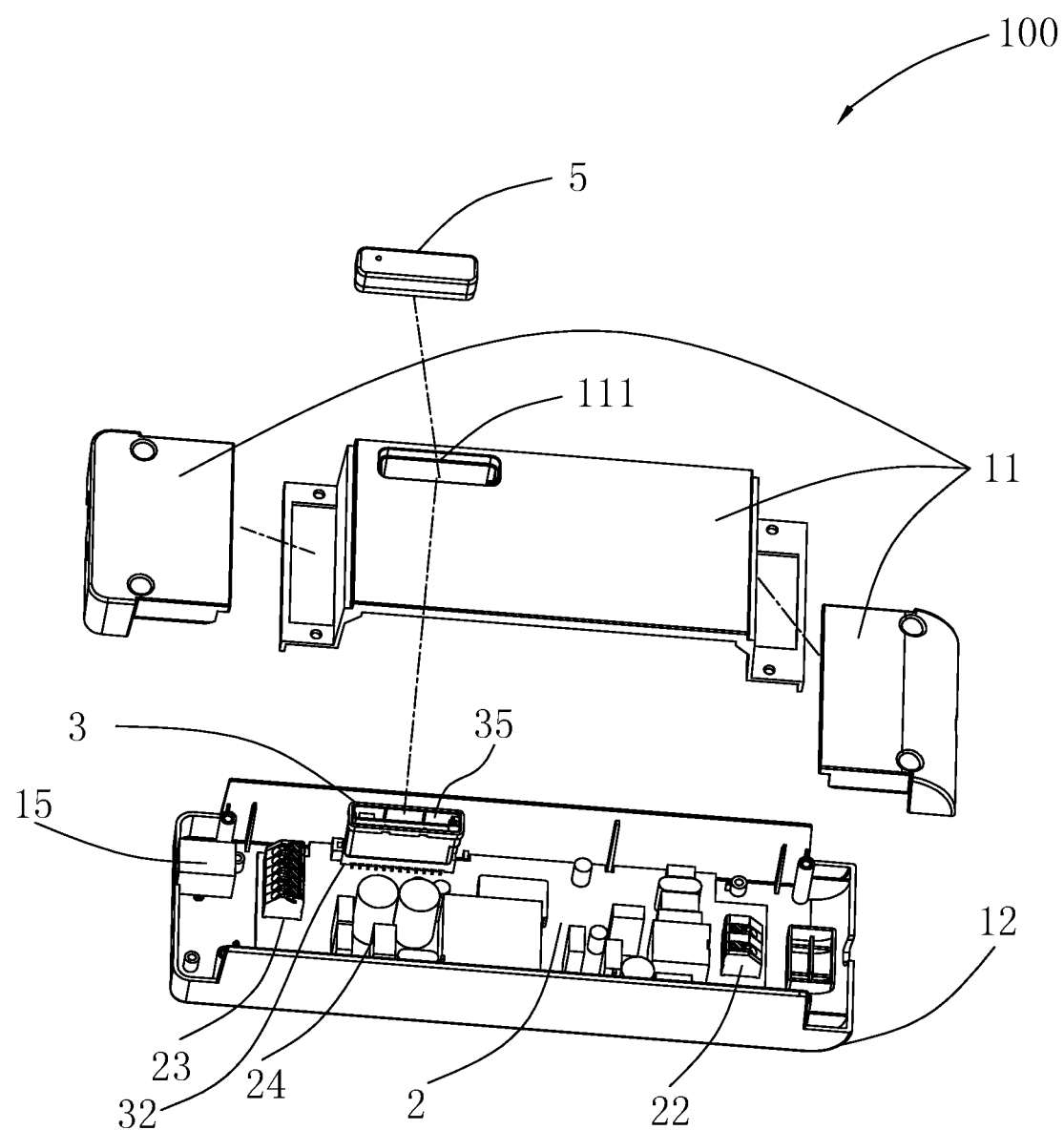
FIG. 3 illustrates a split diagram of the intelligent power adaptor shown in FIG. 1-FIG. 2.
Figure 4:
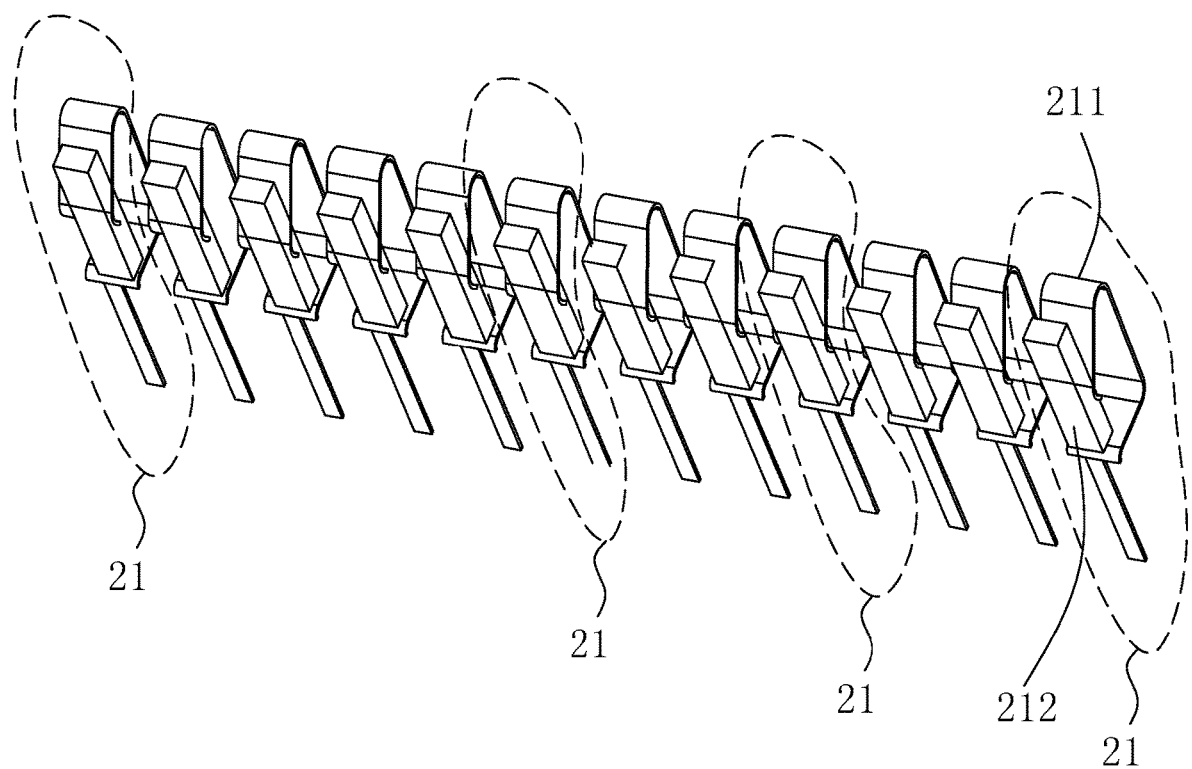
FIG. 4 illustrates a detailed diagram of multiple connecting terminals utilized by the intelligent power adaptor shown in FIG. 3.
Figure 5:
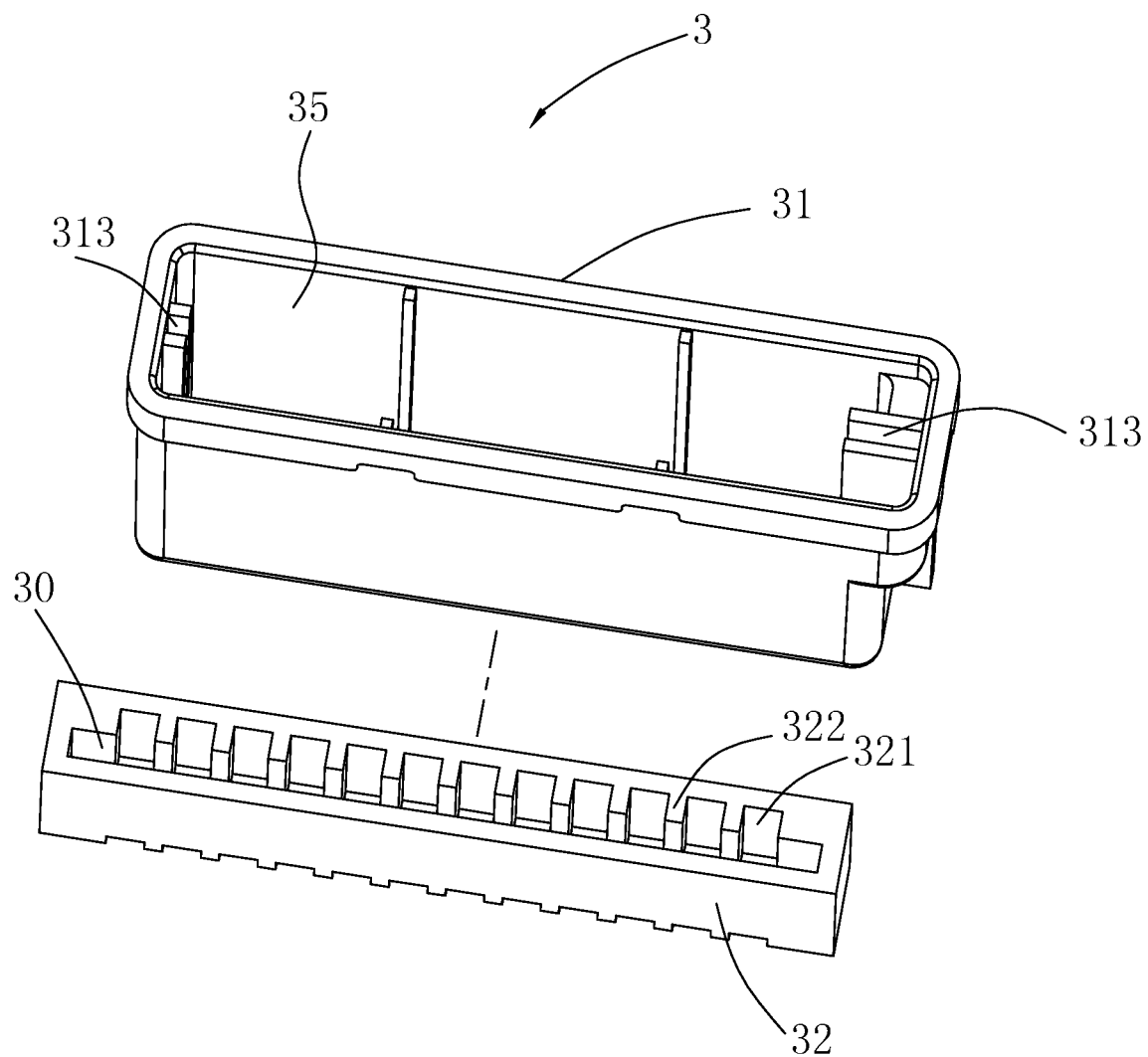
FIG. 5 illustrates a detailed diagram of a holder utilized by the intelligent power adaptor shown in FIG. 3.
Figure 6:
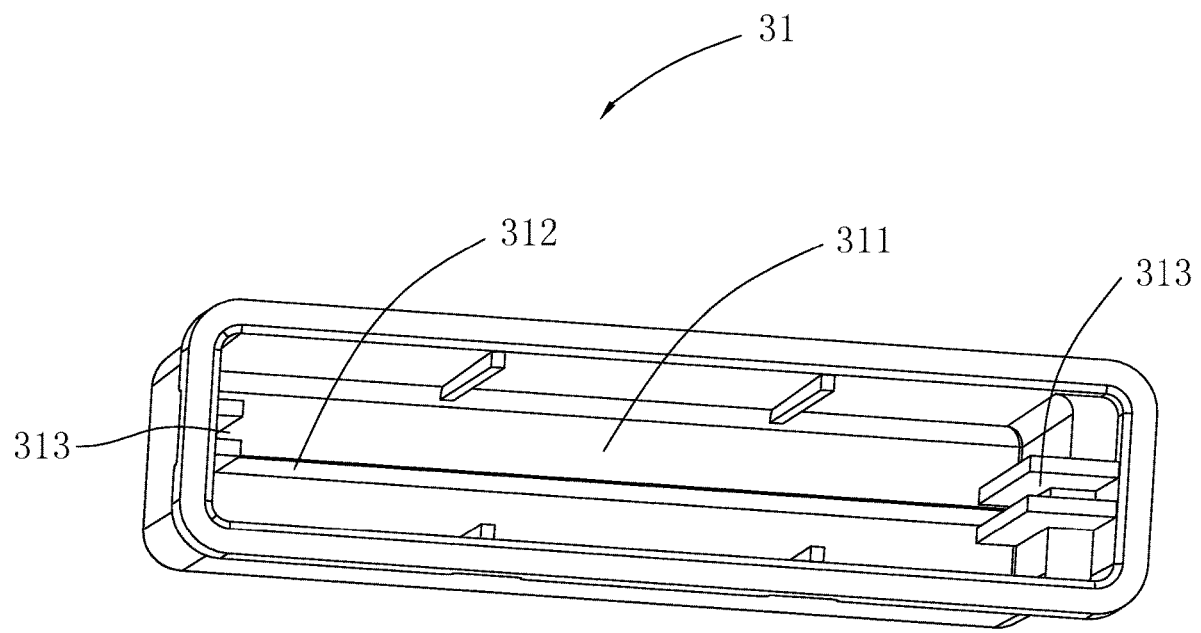
FIG. 6 illustrates a detailed diagram of an encompassing body of the holder shown in FIG. 5.
Figure 7:
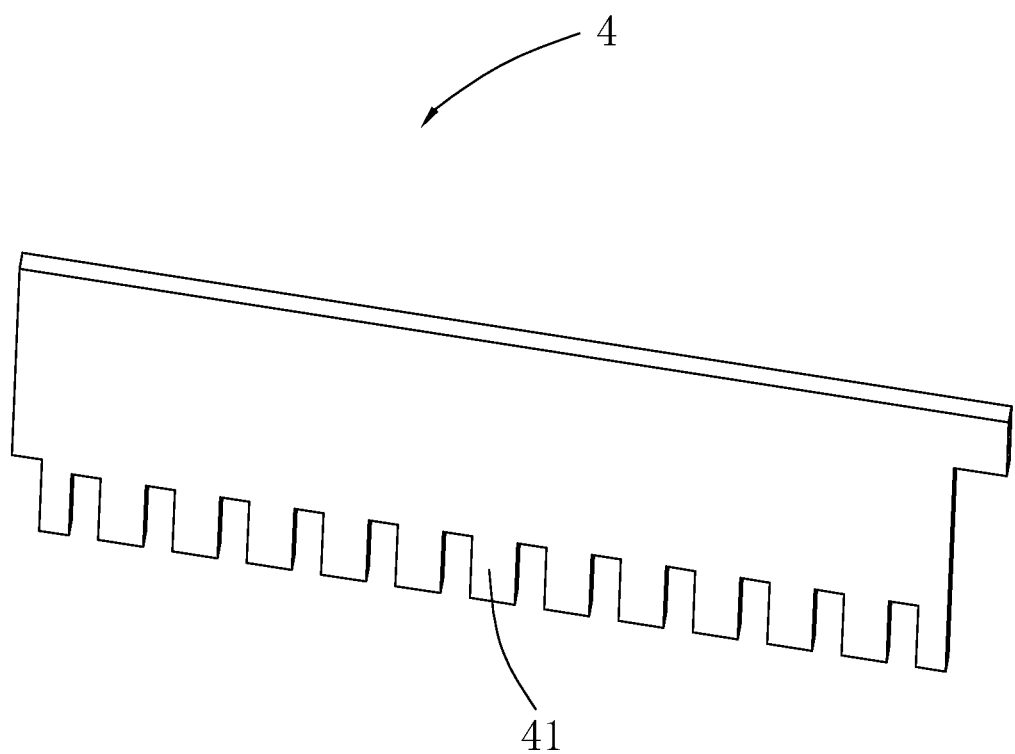
FIG. 7 illustrates a partial detailed diagram of a detachable intelligent current adaptor utilized by the intelligent power adaptor shown in FIG. 3.
Figure 8:
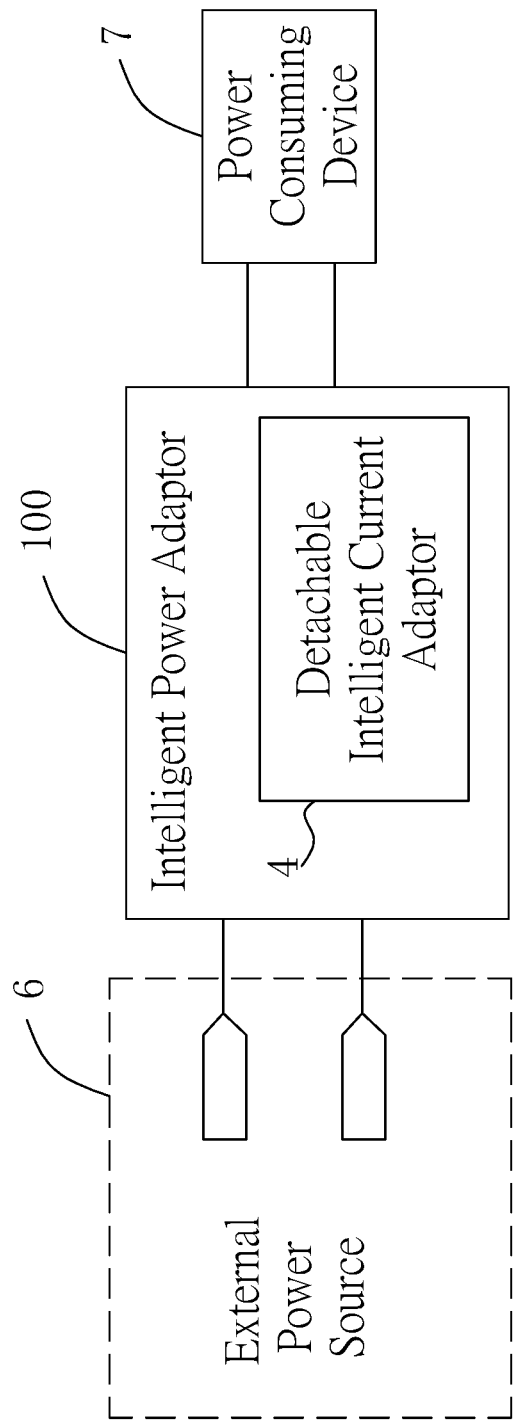
FIG. 8 illustrates a schematic diagram of the intelligent power adaptor shown in FIG. 3 that is electrically connected to an external power source for charging and is electrically coupled to an external illuminating component for powering up.

FIG. 1-FIG. 8 illustrate an intelligent power adaptor 100 for powering up an external power consuming device according to one embodiment of the present invention. FIG. 1 and FIG. 2 illustrate a top view of the intelligent power adaptor 100. FIG. 3 illustrates a split diagram of the intelligent power adaptor 100. FIG. 4 illustrates a detailed diagram of multiple connecting terminals 21 utilized by the intelligent power adaptor 100 according to one example. FIG. 5 illustrates a detailed diagram of a holder 3 utilized by the intelligent power adaptor 100 according to one example. FIG. 6 illustrates a detailed diagram of an encompassing body 31 of the holder 3 shown in FIG. 5. FIG. 7 illustrates a partial detailed diagram of a detachable intelligent current adaptor 4 utilized by the intelligent power adaptor 100 according to one example. FIG. 8 illustrates a schematic diagram of the intelligent power adaptor 100 that is electrically connected to an external power source 6 for charging and an external illuminating component 7 for powering up.

As shown in FIG. 1, FIG. 3 and FIG. 7, the intelligent power adaptor 100 includes a housing 1, a circuit board 2, a holder 3 and a detachable intelligent current adaptor 4.

The housing 1 has an internal space and an insertion through hole 111. The insertion through hole 111 is used for receiving the detachable intelligent current adaptor 4 for insertion.

The circuit board 2 is disposed within the internal space. Also, the circuit board includes multiple connecting terminals 21, which are blocked by the holder 3 but shown in FIG. 4.

The holder 3 is coupled to the circuit board 2. In addition, the holder 3 is disposed above the circuit board 2 and within the internal space. The holder 3 includes an opening 35 for encompassing multiple connecting terminals 21.

The detachable intelligent current adaptor 4 is detachably coupled to the holder 3 via the opening 35. Also, the detachable intelligent current adaptor 4 is externally coupled to the housing 1 via the insertion through hole 111. In addition, the detachable intelligent current adaptor 4 includes a plurality of connecting terminals 41. Each of the connecting terminal 41 is detachably docked with and electrically coupled to a corresponding connecting terminal 21 in one-by-one correspondence. Such that the detachable intelligent current adaptor 4 can match and cooperate with the circuit board 2.

With the aid of the docking between each pair of the connecting terminals 21 and 41, the detachable intelligent current adaptor 4 can be freely inserted to configure on the intelligent power adaptor 100. In addition, the detachable intelligent current adaptor 4 can also be freely detached from the intelligent power adaptor 100 to replace other types of detachable intelligent current adaptor 4 for configuring various types of intelligent protocols. In this way, the lack of flexibility for the conventional intelligent power adaptor in applying new protocols can be neutralized.

As shown in FIG. 4, each of the multiple connecting terminals 21 includes a pair of pieces, such as a pair of exemplary pieces 211 and 212. The pair of pieces 211 and 212 are coupled to each other. Also, the pair of pieces 211 and 212 form a clamp for clamping a corresponding connecting terminal 41, in response to insertion of the detachable intelligent current adaptor 4. In this way, each connecting terminal 21 clamps a corresponding connecting terminal 41. In some examples, some partial pairs of the connecting terminals 21 and 41 are used for power transmission, and some other partial pairs of the connecting terminals 21 and 41 are used for signal communications.

As shown in FIG. 2, in some examples, the circuit board 2 also includes a power input terminal 22 and a power output terminal 23. The power input terminal 22 is electrically coupled to an external power source 6 via a partial set of the multiple connecting terminals 21, for the purpose of power input transmission. The power output terminal 23 is electrically coupled to a power consuming device 7 (e.g., an external illuminating device) via another partial set of the multiple connecting terminals 21. In this way, the detachable intelligent current adaptor 4 is capable of adjusting a current flowing between the power input terminal 22 and the poser output terminal 23, i.e., a current flowing between the external power source 6 and the power consuming device 7, in an intelligent manner with the aid of a power adjusting protocol loaded on the detachable intelligent current adaptor 4. When the power consuming device 7 is an illuminating component, the detachable intelligent current adaptor 4 is capable of adjusting its illuminance according to its configured intelligent protocol.

Also, in some examples, the circuit board 2 includes at least one electronic component 24, such as capacitors. The at least one electronic component 24 are electrically coupled to a certain set of the connecting terminals 21 for power and/or signal transmissions.

In some examples, the holder 3 is welded to the circuit board 2 for forming an integral structure. In this way, the combination of the board 2 and the holder 3 has an improved structural strength.

In some examples, as shown in FIG. 5, the holder 3 includes a support body 32 and an encompassing body 31. The support body 32 is disposed on the circuit board 2. Also, the opening 35 is formed above the support body 32. The encompassing body 31 is coupled to and disposed above the support body 32. The opening 35 is formed within the encompassing body 31. In some examples, the support body 32 is welded on the circuit board 2 to form an integral structure for better structural strength. Additionally, in some examples, the support body 32 and the encompassing body 31 form an integral structure for a better structural strength in between.

In some examples, as shown in FIG. 5, the support body 32 includes multiple insulating protrusions 321 and at least one or multiple indentations 322. Each the indentation 322 separates two consecutive insulating protrusions 321. Also, each the indentation 322 receives one corresponding connecting terminal 21. In other words, each the connecting terminal 21 is separated by a corresponding insulating protrusion 321. Such that operations of the multiple connecting terminals are mutually independent and substantially free from mutual interference.

In some examples, as shown in FIG. 6, the encompassing body 31 includes multiple lateral trenches 313. The lateral trenches are disposed within the encompassing body 31, i.e., within the opening 35. Also, the multiple lateral trenches 35 detachably affix to the detachable intelligent current adaptor 4 upon insertion of the detachable intelligent current adaptor 4. Such that the detachable intelligent current adaptor 4 can be more stably inserted into the circuit board 2.

In some examples, as shown in FIG. 6, the encompassing body 31 includes an arc-shaped base plate 311. And the arc-shaped base plate 311 is disposed within the opening 35. The arc-shaped base plate 312 includes a seam 312. Specifically, the arc-shaped base plate 311 is concave towards the seam 312. In this way, the seam 312 can be used for guiding the insertion of the connecting terminals 41. Such that the seam 312 receives the detachable intelligent current adaptor 4, and the connecting terminals 21 and 41 are electrically coupled to each other.

In some examples, the arc-shaped base plate 311 is coupled to the support body 32. Such that the encompassing body 31 is coupled to the support body 32.

In some examples, the connecting terminals 21 are exposed to the detachable intelligent current adaptor 4 via the seam 312. Therefore, the connecting terminals 21 are exposed for preparation of electrically coupling to the connecting terminals 41.

In some examples, as shown in FIG. 1, the housing 1 includes an upper casing 11 and a lower casing 12. The upper casing 11 includes the insertion through hole 111 for allowing the detachable intelligent current adaptor 4 to pass through. The lower casing 12 is detachably coupled to the upper casing 11. Also, the lower casing 12 loads the circuit board 2 for support.

For protecting the inserted detachable intelligent current adaptor 4, in some examples, the intelligent power adaptor 100 also includes a cap 5 for covering the insertion through hole 111.

In some examples, the housing 1 includes an input jack 13. The input jack 13 is electrically coupled to both the external power source 6 and the power input terminal 22 for relaying power to the detachable intelligent current adaptor 4. In some examples, the input jack 13 is disposed between the upper casing 11 and the lower casing 12.

In some examples, the housing 1 includes an output jack 14. The output jack 14 is electrically coupled to both the external power consuming device 7 and the power output terminal 23. Therefore, power is relayed from the intelligent current adaptor 4 to the external power consuming device 7. In some examples, the output jack 14 is disposed between the upper casing 11 and the lower casing 12.

In one example, the housing 1 includes a network socket 15, which is electrically coupled to an external communication device (not illustrated) for required communications.

In some examples, the intelligent current adaptor 4 may be replaced by other types (or protocols) of intelligent modules, such as a Zigbee module, a Ble module, a Wifi module, a DC module (with a voltage range from 0 volts to 10 volts), an infrared module, a DALi module, or an upgrade version thereof. Such that the intelligent power adaptor 100 can improve its adaptability and user experience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An intelligent power adaptor, comprising:
    a housing, having an internal space and an insertion through hole;
    a circuit board, disposed within the internal space, the circuit board comprising a plurality of first connecting terminals;
a holder, coupled to the circuit board, disposed above the circuit board, and disposed within the internal space, the holder comprising an opening for encompassing the plurality of first connecting terminals; and
    a detachable intelligent current adaptor, detachably coupled to the holder via the opening and externally coupled to the housing via the insertion through hole, the detachable intelligent current adaptor comprising a plurality of second connecting terminals that are detachably docked with and electrically coupled to the plurality of first connecting terminals in one-by-one correspondence;
    wherein each of the plurality of first connecting terminals comprises:
    a first flexible piece; and
    a second flexible piece, integrally coupled to the first flexible piece;
    wherein the first flexible piece and the second flexible piece are configured to form a clamp for clamping a corresponding second connecting terminal out of the plurality of second connecting terminals in response to insertion of the detachable intelligent current adaptor;
    wherein the circuit board further comprises:
    a power input terminal, electrically coupled to a first set out of the plurality of first connecting terminals; and a power output terminal, electrically coupled to a second set out of the plurality of first connecting terminals; and
    wherein the detachable intelligent current adaptor is further configured to adjust a current flowing between the power input terminal and the poser output terminal.

2. The intelligent power adaptor of claim 1, wherein the circuit board further comprises: at least one electronic component, electrically coupled to a third set out of the plurality of first connecting terminals.

3. The intelligent power adaptor of claim 1, wherein the holder is welded to the circuit board for forming an integral structure.

4. The intelligent power adaptor of claim 1, wherein the housing comprises an input jack for electrically coupled to an external power source and the power input terminal.

5. The intelligent power adaptor of claim 1, wherein the housing comprises an output jack for electrically coupled to an external power consuming device and the power output terminal.

6. The intelligent power adaptor of claim 1, wherein the housing comprises a network socket for electrically coupled to an external communication device.

7. The intelligent power adaptor of claim 1, wherein the housing comprises:
    an upper casing, comprising an insertion through hole for allowing the detachable intelligent current adaptor to pass through; and
    a lower casing, detachably coupled to the upper casing, wherein the lower casing is configured to load the circuit board.

8. The intelligent power adaptor of claim 7, further comprising a cap for covering the insertion through hole.

9. The intelligent power adaptor of claim 1, wherein the holder further comprises:
- a support body, disposed on the circuit board, wherein the opening is formed above the support body; and
- an encompassing body, coupled to and disposed above the support body,
- wherein the opening is formed within the encompassing body.

10. The intelligent power adaptor of claim 9, wherein the support body is welded on the circuit board.

11. The intelligent power adaptor of claim 9, wherein the support body and the encompassing body form an integral structure.

12. The intelligent power adaptor of claim 9, wherein the support body comprises:
- a plurality of insulating protrusions; and
- a plurality of indentations, each of which is configured to separate two consecutive insulating protrusions out of the plurality of insulating protrusions and is configured to receive one corresponding first connecting terminal out of the plurality of first connecting terminals.

13. The intelligent power adaptor of claim 9, wherein the encompassing body comprises a plurality of lateral trenches disposed within, and the plurality of lateral trenches are configured to detachably affix to the detachable intelligent current adaptor upon insertion of the detachable intelligent current adaptor.

14. The intelligent power adaptor of claim 13, wherein the encompassing body further comprises:
- an arc-shaped base plate, disposed within the opening, the arc-shaped base plate comprises a seam, for guiding the insertion of the detachable intelligent current adaptor and for receiving the detachable intelligent current adaptor.

15. The intelligent power adaptor of claim 14, wherein the plurality of first connecting terminals are exposed to the detachable intelligent current adaptor via the seam.

16. The intelligent power adaptor of claim 14, wherein the arc-shaped base plate is coupled to the support body, such that the encompassing body is coupled to the support body.

\* \* \* \* \*